(12) United States Patent
Hartig et al.

(10) Patent No.: US 7,192,648 B2
(45) Date of Patent: Mar. 20, 2007

(54) THIN FILM COATING HAVING TRANSPARENT BASE LAYER

(75) Inventors: Klaus Hartig, Avoca, WI (US); Annette J. Krisko, Prairie du Sac, WI (US)

(73) Assignee: Cardinal CG Company, Eden Prairie, MN (US)

( * ) Notice: Subject to any disclaimer, the term of this patent is extended or adjusted under 35 U.S.C. 154(b) by 64 days.

(21) Appl. No.: 11/049,180

(22) Filed: Feb. 2, 2005

(65) Prior Publication Data

US 2005/0191513 A1   Sep. 1, 2005

Related U.S. Application Data

(62) Division of application No. 10/087,662, filed on Mar. 1, 2002, now Pat. No. 6,919,133.

(51) Int. Cl.
   *B32B 17/06* (2006.01)
(52) U.S. Cl. .............. 428/432; 428/428; 428/697; 428/698; 428/701; 428/702; 428/704
(58) Field of Classification Search ............ 428/428, 428/432, 697, 698, 701, 702, 704
   See application file for complete search history.

(56) References Cited

U.S. PATENT DOCUMENTS

| | | | |
|---|---|---|---|
| 3,885,855 A | 5/1975 | Gross | 350/1 |
| 3,962,488 A | 6/1976 | Gillery | 427/109 |
| 4,019,887 A | 4/1977 | Kirkbride et al. | 65/60 |
| 4,045,125 A | 8/1977 | Farges | 350/166 |
| 4,100,330 A | 7/1978 | Donley | 428/429 |
| 4,166,018 A | 8/1979 | Chapin | 204/192 |
| 4,188,444 A | 2/1980 | Landau | 428/428 |
| 4,188,452 A | 2/1980 | Groth | 428/336 |
| 4,462,883 A | 7/1984 | Hart | 204/192 |
| 4,485,146 A | 11/1984 | Mizuhashi et al. | 428/428 |
| 4,610,771 A | 9/1986 | Gillery | 204/192.1 |
| 4,619,729 A | 10/1986 | Johncock et al. | 156/606 |
| 4,737,252 A | 4/1988 | Hoffman | 204/192 |
| 4,737,379 A | 4/1988 | Hudgens et al. | 427/39 |
| 4,773,717 A | 9/1988 | Pai et al. | 350/3.7 |
| 4,790,922 A | 12/1988 | Huffer | 204/192 |
| 4,806,220 A | 2/1989 | Finley | 204/192 |
| 4,847,157 A | 7/1989 | Goodman et al. | 428/426 |
| 4,859,532 A | 8/1989 | Oyama et al. | 428/336 |
| 4,894,290 A | 1/1990 | Chesworth et al. | 428/426 |
| 4,902,081 A | 2/1990 | Huffer | 350/1.7 |
| 4,919,778 A | 4/1990 | Dietrich et al. | 204/192 |

(Continued)

FOREIGN PATENT DOCUMENTS

CA    2115320    8/1994

(Continued)

*Primary Examiner*—Jennifer McNeil
*Assistant Examiner*—G. Blackwell
(74) *Attorney, Agent, or Firm*—Fredrickson & Byron, P.A.

(57) ABSTRACT

The invention provides thin film coatings that have a transparent base layer. For example, the invention provides low-emissivity coatings with a transparent base layer. In certain embodiments, a silicon dioxide base layer is used. Methods of producing thin film coatings having a transparent base layer are provided as well. In one embodiment, sputter deposition is utilized to produce these coatings.

20 Claims, 6 Drawing Sheets

U.S. PATENT DOCUMENTS

| | | | |
|---|---|---|---|
| 4,946,712 A | 8/1990 | Goodman et al. | 427/166 |
| 4,996,105 A | 2/1991 | Oyama et al. | 428/336 |
| 5,000,528 A | 3/1991 | Kawakatsu | 350/1.7 |
| 5,135,808 A | 8/1992 | Kimock et al. | 428/336 |
| 5,153,054 A | 10/1992 | Depauw et al. | 428/216 |
| 5,168,003 A | 12/1992 | Proscia | 428/216 |
| 5,190,807 A | 3/1993 | Kimock et al. | 428/216 |
| 5,201,926 A | 4/1993 | Szczyrbowski et al. | 65/60 |
| 5,268,217 A | 12/1993 | Kimock et al. | 428/216 |
| 5,279,722 A | 1/1994 | Szczyrbowski et al. | 204/192.27 |
| 5,288,527 A | 2/1994 | Jousse et al. | 427/579 |
| 5,296,302 A | 3/1994 | O'Shaughnessy et al. | 428/472 |
| 5,302,449 A | 4/1994 | Eby et al. | 428/336 |
| 5,308,706 A | 5/1994 | Kawaguchi et al. | 428/426 |
| 5,318,685 A | 6/1994 | O'Shaughnessy et al. | 204/192.27 |
| 5,328,768 A | 7/1994 | Goodwin | 428/428 |
| 5,337,191 A | 8/1994 | Austin | 359/885 |
| 5,344,718 A | 9/1994 | Hartig et al. | 428/623 |
| 5,372,874 A | 12/1994 | Dickey et al. | 428/216 |
| 5,394,269 A | 2/1995 | Takamatsu et al. | 359/580 |
| 5,411,794 A | 5/1995 | Kawaguchi et al. | 428/216 |
| 5,424,130 A | 6/1995 | Nakanishi et al. | 428/410 |
| 5,505,989 A | 4/1996 | Jenkinson | 427/166 |
| 5,508,092 A | 4/1996 | Kimock et al. | 428/216 |
| 5,510,173 A | 4/1996 | Pass et al. | 428/216 |
| 5,520,996 A | 5/1996 | Balian et al. | 428/216 |
| 5,578,103 A | 11/1996 | Araujo et al. | 65/60.5 |
| 5,580,364 A | 12/1996 | Goodman et al. | 65/60.2 |
| 5,635,245 A | 6/1997 | Kimock et al. | 427/249 |
| 5,637,353 A | 6/1997 | Kimock et al. | 427/255.3 |
| 5,645,699 A | 7/1997 | Sieck | 204/192 |
| 5,688,585 A | 11/1997 | Lingle et al. | 428/216 |
| 5,718,980 A | 2/1998 | Koch et al. | 428/428 |
| 5,745,291 A | 4/1998 | Jenkinson | 359/586 |
| 5,749,931 A | 5/1998 | Goodman et al. | 65/60.1 |
| 5,756,192 A | 5/1998 | Crawley et al. | 428/216 |
| 5,763,063 A | 6/1998 | Pass et al. | 428/216 |
| 5,834,103 A | 11/1998 | Bond et al. | 428/216 |
| 5,876,854 A | 3/1999 | Kawazu et al. | 428/428 |
| 5,891,556 A | 4/1999 | Anderson et al. | 428/216 |
| 5,935,702 A | 8/1999 | Macquart et al. | 428/336 |
| 5,938,958 A | 8/1999 | Goodman et al. | 219/219 |
| 5,962,115 A | 10/1999 | Zmelty et al. | 428/216 |
| 5,976,678 A | 11/1999 | Kawazu et al. | 428/208 |
| 6,001,485 A | 12/1999 | Kobayashi et al. | 428/428 |
| 6,007,901 A | 12/1999 | Maschwitz et al. | 428/216 |
| 6,045,896 A | 4/2000 | Boire et al. | 428/216 |
| 6,060,178 A | 5/2000 | Krisko | 428/627 |
| 6,068,914 A | 5/2000 | Boire et al. | 428/216 |
| 6,071,623 A | 6/2000 | Sugawara et al. | 428/428 |
| 6,086,210 A | 7/2000 | Krisko et al. | 359/883 |
| 6,090,481 A | 7/2000 | Depauw et al. | 428/336 |
| 6,139,969 A | 10/2000 | Finley | 428/432 |
| 6,210,784 B1 | 4/2001 | Rondeau et al. | 428/212 |
| 6,231,999 B1 | 5/2001 | Krisko | 428/627 |
| 6,316,111 B1 | 11/2001 | Krisko | 428/434 |
| 6,322,881 B1 | 11/2001 | Boire et al. | 428/216 |
| 6,346,174 B1 | 2/2002 | Finley et al. | 204/192.15 |
| 6,524,688 B1 | 2/2003 | Eby et al. | 428/216 |
| 6,585,871 B1 | 7/2003 | Anzaki et al. | 204/298.14 |
| 6,855,369 B2 | 2/2005 | Nakamura | |
| 2002/0102352 A1 | 8/2002 | Hartig et al. | 427/165 |
| 2003/0180547 A1 | 9/2003 | Buhay et al. | 428/434 |

FOREIGN PATENT DOCUMENTS

| | | |
|---|---|---|
| DE | 39 41 026 A1 | 7/1990 |
| DE | 39 06 374 A1 | 9/1990 |
| DE | 39 42 990 A1 | 6/1991 |
| DE | 42 11 363 A1 | 10/1993 |
| DE | 195 33 053 C1 | 4/1997 |
| EP | 0 104 870 A2 | 4/1984 |
| EP | 0 343 695 B1 | 11/1989 |
| EP | 0 275 662 B1 | 11/1990 |
| EP | 0 464 701 A2 | 1/1992 |
| EP | 0 303 109 B1 | 3/1992 |
| EP | 0 543 077 A1 | 5/1993 |
| EP | 0 622 645 A1 | 11/1994 |
| EP | 0 636 587 A2 | 2/1995 |
| EP | 0 718 250 A2 | 6/1996 |
| EP | 0 722 913 B1 | 7/1996 |
| EP | 0 583 871 B1 | 11/1996 |
| EP | 0 761 618 A1 | 3/1997 |
| EP | 0 747 330 B1 | 4/1999 |
| FR | 2781789 A | 2/2000 |
| GB | 2 031 756 A | 10/1978 |
| GB | 2 129 831 A | 9/1983 |
| GB | 2 126 256 A | 3/1984 |
| GB | 2 186 001 A | 8/1987 |
| JP | 11157881 | 12/1997 |
| WO | WO 84/02128 | 6/1984 |
| WO | WO 91/10564 | 7/1991 |
| WO | WO 91/14016 | 9/1991 |
| WO | WO 95/13189 | 5/1995 |
| WO | WO 97/48649 | 12/1997 |
| WO | WO 00/32530 | 6/2000 |
| WO | WO 01/44131 | 12/2000 |
| WO | WO 03/074442 | 9/2003 |

THIN FILM COATING HAVING TRANSPARENT BASE LAYER

RELATED APPLICATIONS

The present application is a divisional application of U.S. application Ser. No. 10/087,662, filed Mar. 1, 2002 now U.S. Pat. No. 6,919,133, the entire contents of which are herein incorporated by reference.

FIELD OF THE INVENTION

The present invention provides thin film coatings for glass and other substrates. More particularly, this invention provides thin film coatings that are particularly durable to heat treatment (e.g., tempering). The invention also provides methods for producing coatings of this nature, as well as substrates bearing these coatings.

BACKGROUND OF THE INVENTION

Low-emissivity coatings are well known in the art. Typically, they include one or more layers of infrared-reflective material and two or more transparent dielectric layers. The infrared-reflective layers, which are typically conductive metals such as silver, gold, or copper, reduce the transmission of radiant heat through the coating. The transparent dielectric layers are used primarily to reduce visible reflectance and to control other properties of the coatings, such as color. Commonly used transparent dielectrics include oxides of zinc, tin, and titanium. Low-emissivity coatings are commonly deposited on glass sheets through the use of well known magnetron sputtering techniques.

It is often necessary to heat glass sheets to temperatures at or near the melting point of glass to temper the sheets or to enable them to be bent into desired shapes, such as motor vehicle windshields. Tempering is important for glass used in automobile windows, and particularly for glass used in automobile windshields. Upon breaking, tempered glass desirably exhibits a break pattern in which the glass shatters into a great many small pieces, rather than large dangerous shards. This coated glass must often be able to withstand elevated tempering temperatures, commonly on the order of about 600 degrees C. and above, for significant periods of time (e.g., hours).

Many low-emissivity film stacks that employ silver as the infrared-reflective material (i.e., silver-based low-emissivity coatings) cannot withstand elevated tempering temperatures without some deterioration of the silver. In one reported method for avoiding this problem, glass sheets are heated and bent or tempered before they are coated, and are later provided with the desired coatings. However, this procedure tends to be complicated and costly and, more problematically, may produce non-uniform coatings.

Another reported method for protecting reflective silver films from deterioration at high temperatures involves sandwiching each silver film between protective layers of an oxidizable and/or nitridable metal. The protective layers are thick enough and reactive enough that when the coated glass is heated to high temperatures, these layers capture oxygen and/or nitrogen that might otherwise reach and react with the reflective silver films. While these protective layers prevent oxygen and nitrogen from reaching the silver films, they become largely oxidized and/or nitrided themselves. Insofar as the oxides and nitrides of the protective metals are more transparent than the protective metals themselves, this typically causes an increase in the transmissivity of the coating.

Reference is made to Huffer et al. U.S. Pat. No. 4,790,922, Finley U.S. Pat. No. 4,806,220, and Gillery U.S. Pat. No. 3,962,488, the entire teachings of each of which are incorporated herein by reference.

U.S. Pat. No. 5,344,718 (Hartig et al.) describes use of a film stack in which silver is sandwiched between layers of nickel or nichrome and the resulting sandwich is positioned between films of silicon nitride. It is said that when a Ni:Cr alloy is employed, the chromium during sputtering is converted at least in part to a nitride of chromium and that visible transmittance is thus improved.

U.S. Pat. Nos. 6,060,178 and 6,231,999, both issued to Krisko, disclose particularly useful heat-treatable coatings in which niobium is positioned on one or both sides of an infrared-reflective layer. When an oxide or nitride film is subsequently deposited over the niobium (e.g., when such film is sputtered onto the niobium in a reactive oxidizing or nitriding atmosphere), the niobium may be converted at least in part to an oxide or nitride of niobium. Insofar as the oxides and nitrides of niobium are more transparent than metallic niobium, this increases the visible transmittance of the coating. The entire teachings of each of these patents (the "Krisko niobium patents") are incorporated herein by reference.

Protective layers should be deposited at sufficient thickness to prevent deterioration of infrared-reflective material (e.g., silver) during heat treatment. When these protective layers are too thin, they tend not to fully protect the infrared-reflective material during heat treatment. For example, when the protective layer or layers in a low-emissivity coating are too thin, the coating may develop a white hazy appearance (which is referred to herein as "white haze") when tempered or otherwise heat-treated. The precise mechanism behind white haze formation does not appear to have been satisfactorily explained. However, it is surmised to be a result of oxygen reaching, and reacting with, the infrared-reflective material in the coating. For example, when silver in a low-emissivity coating is not aptly protected, tempering appears to cause the silver to become non-continuous, forming islands of silver breaking up the originally continuous layer. On the other hand, when protective layers are too thick, they tend not to be oxidized to the desired extent, leaving the coating more reflective and/or less transparent than is preferred. In the case of niobium protective layers, this can yield a coating with a somewhat reddish appearance, due to the color of metallic niobium. Thus, care should be taken to assure that protective layers of an appropriate thickness and reactive state are selected for heat-treatable coatings.

The application of heat to coated glass (e.g., during tempering and other heat treatments) tends to exacerbate the visible impact of any defects on the glass. For example, substrate defects may first appear, or may become more visible, after heat treatment. Therefore, substrate quality is particularly important in the production of heat-treatable coatings.

For example, it is preferable to deposit thin films on newly manufactured (i.e., fresh) glass. As is well known in the art, glass is vulnerable to becoming corroded when exposed to moisture (e.g., water in the air of ambient glass processing and storage environments). In fact, it is virtually impossible for a manufacturer of coated glass to assure that the raw glass it uses (i.e., coats) is completely free of moisture corrosion.

Moisture corroded glass typically has a rough surface. For example, corroded glass may exhibit different degrees of surface roughness in different areas. This can be appreciated in FIG. 1, wherein there is illustrated a substrate 10 having relatively rough 17 and smooth 14 surface areas. The rough areas 17 may comprise a series of small peaks and valleys. While FIG. 1 is not intended to represent precisely the surface roughness that characteristically results from moisture corrosion, moisture corroded glass has been found to exhibit locally varying degrees of roughness.

Surface defects may also result when uncoated glass sheets are engaged by glass handling equipment. For example, rollers and suction cups can leave surface modifications (e.g., increased roughness, scuffmarks, or other traces of contact) on the glass. These surface modifications can impact the coatings that are ultimately deposited on the uncoated glass. For example, traces of contact from suction cups and/or rollers may become visible, or more visible, when sheets of coated glass are tempered or otherwise heat-treated.

Thus, the manufacture of high quality coated glass can be challenging due to the commonly less than optimal quality of raw (i.e., uncoated) glass. For example, according to conventional wisdom in the art, when thin films are coated upon a rough (e.g., corroded) substrate surface, the roughness of the coating tends to increase as more and more film is deposited. Not only may this yield coated glass with an undesirably rough coated surface, it can also have adverse effects on the desired properties of the coating.

For example, temperable low-emissivity glass has been found to exhibit an objectionable appearance more frequently when produced with glass that is old (and more likely corroded by exposure to moisture) than when produced with fresh glass. Similarly, temperable low-emissivity glass has been found to exhibit an objectionable appearance more frequently when produced with glass that has been stored under conditions promoting moisture corrosion (e.g., high humidity). Such glass tends to have a non-uniform appearance, characterized by local areas of haze and low transparency.

In an attempt to obviate this problem, one might increase the thickness of the protective layer overlying each reflective silver film. However, this may not improve the appearance of the coated glass. For example, the protective layer may not be oxidized and/or nitrided as fully as is desired. As a consequence, the visible reflectance of the coating may be greater than is preferred. Further, the transparency of the coating may be decreased, and the color of the coated glass may be adversely affected. For example, increasing the thickness of niobium protective layers has been found to yield glass with local areas of reddish haze. Surprisingly, no matter what thickness is selected for the protective layers, there tend always to be local areas of haze (e.g., white haze, red haze, or both) and low transparency, which give the glass a non-uniform appearance. Glass of this nature would typically be rejected in the market place.

It would be desirable to provide thin film coatings that retain their integrity even when applied to corroded substrates. It would be particularly desirable to provide heat-treatable coatings (e.g., temperable low-emissivity coatings) that resist deterioration (e.g., haze formation) even when applied to corroded substrates (e.g., moisture corroded glass).

SUMMARY OF THE INVENTION

It has now been discovered that thin film coatings can be provided with certain base layers to reduce problems associated with corroded substrates. For example, a silicon dioxide base layer has been found to significantly reduce the formation of haze that has otherwise been observed when moisture corroded glass is coated with a temperable low-emissivity coating. Benefits of the present base layer are believed to extend to virtually any thin film coating that may be deposited upon a corroded substrate (e.g., moisture corroded glass).

In one embodiment of the invention, there is provided a substrate bearing a low-emissivity coating. The low-emissivity coating includes a first film layer comprising silicon dioxide formed directly upon the substrate. The silicon dioxide has a thickness of less than 100 angstroms. If so desired, this silicon dioxide can be sputtered. A second film layer comprising a transparent dielectric material is positioned outwardly from (i.e., further from the substrate than) the first film layer. A third film layer comprising an infrared-reflective material is positioned outwardly from the second film layer. A fourth film layer comprising a transparent dielectric material is positioned outwardly from the third film layer. If so desired, additional film layers can be interposed beneath, among, and/or outside any of these film layers.

In another embodiment, the invention provides a substrate bearing a silver-based low-emissivity coating. The low-emissivity coating includes a first film layer comprising silicon dioxide formed directly upon the substrate at a thickness of less than 100 angstroms. The low-emissivity coating also includes at least one infrared-reflective silver-containing film layer. For example, the low-emissivity coating will commonly include either one or two infrared-reflective silver-containing film layers, although three or more such layers may also be provided. Additional film layers can optionally be interposed beneath, among, and/or outside any of these film layers.

A further embodiment of the invention provides a transparent substrate having a given index of refraction. The substrate bears a low-emissivity coating that includes a first film layer comprising transparent material having an index of refraction that is substantially equal to that of the substrate. The first film layer is formed directly upon the substrate at a thickness of less than 100 angstroms. A second film layer comprising a transparent dielectric material is positioned outwardly from the first film layer. A third film layer comprising an infrared-reflective material is positioned outwardly from the second film layer. A fourth film layer comprising a transparent dielectric material is positioned outwardly from the third film layer. If so desired, additional film layers can be interposed beneath, among, and/or outside any of these film layers.

In another embodiment, the invention provides a transparent substrate having a given index of refraction. The substrate has a moisture-corroded major surface bearing a low-emissivity coating. The low-emissivity coating comprises a first film layer of amorphous material formed directly upon the moisture-corroded major surface of the substrate. This amorphous film layer has a thickness of less than 100 angstroms. Further from the substrate than the amorphous first layer there is positioned a second film layer comprising a transparent dielectric material. A third film layer comprising an infrared-reflective material is positioned outwardly from the second film layer. A fourth film layer comprising a transparent dielectric material is positioned further from the substrate than the third film layer. Additional film layers can optionally be interposed beneath, among, and/or outside any of these film layers.

In another embodiment, the invention provides a substrate bearing a low-emissivity coating. The low-emissivity coating includes a first film layer comprising silicon dioxide formed directly on the substrate. The silicon dioxide in this embodiment can have any desired thickness and, if so desired, can be sputtered. A second film layer comprising a transparent dielectric material is positioned outwardly from the first film layer. A third film layer comprising an infrared-reflective material is positioned outwardly from the second film layer. An intermediate film region comprising at least three film layers is positioned outwardly from the third film layer. A seventh film layer comprising an infrared-reflective material is positioned outwardly from the intermediate film region. An eighth film layer comprising a transparent dielectric material is positioned outwardly from the seventh film layer. Additional film layers can also be interposed beneath, among, and/or outside any of these film layers.

In still another embodiment, there is provided a substrate bearing a low-emissivity coating. The low-emissivity coating includes a first film layer comprising silicon dioxide formed directly upon the substrate. The silicon dioxide can have any desired thickness and, if so desired, can be sputtered. A second film layer comprising a transparent dielectric material is positioned outwardly from the first film layer. A third film layer comprising an infrared-reflective material is positioned outwardly from the second film layer. A fourth protective film layer comprising niobium is formed directly upon the third film layer. A fifth film layer comprising a transparent dielectric material is positioned outwardly from the fourth protective film layer. Additional film layers can be interposed beneath, among, and/or outside any of these film layers, if so desired.

In yet another embodiment, there is provided a substrate bearing a low-emissivity coating. The low-emissivity coating includes a first film layer comprising silicon dioxide formed directly upon the substrate. The silicon dioxide has a thickness of less than 100 angstroms. A second film layer comprising an oxide of zinc and tin is positioned outwardly from the first film layer. A third film layer comprising an oxide of zinc is positioned outwardly from the second film layer. A fourth film layer comprising an infrared-reflective material is positioned outwardly from a third film layer. A protective fifth film layer is formed directly upon the fourth film layer. A sixth film layer comprising an oxide of zinc is positioned outwardly from the fifth protective film layer. A seventh film layer comprising an oxide of zinc and tin is positioned outwardly from the sixth film layer. An eighth film layer comprising an oxide of zinc is positioned outwardly from the seventh film layer. A ninth film layer comprising an infrared-reflective material is positioned outwardly from the eighth film layer. A protective tenth film layer formed directly upon the ninth film layer. An eleventh film layer comprising an oxide of zinc is positioned outwardly from the tenth film layer. A twelfth film layer comprising an oxide of zinc and tin is positioned outwardly from the eleventh film layer. A thirteenth film layer comprising silicon nitride is positioned outwardly from the twelfth film layer. Other film layers can also be interposed beneath, among, and/or outside any of these film layers. If so desired, additional film layers can be interposed beneath, among, and/or outside any of these film layers.

In a further embodiment of the invention, there is provided a substrate bearing a low-emissivity coating. The low-emissivity coating includes a first film layer comprising silicon dioxide formed directly upon the substrate. The substrate has a thickness of less than 100 angstroms. A second film layer comprising titanium oxide and/or silicon nitride is positioned outwardly from the first film layer. A third film layer comprising an oxide of zinc is positioned outwardly from the second film layer. A fourth film layer comprising an infrared-reflective material is positioned outwardly from the third film layer. A protective fifth film layer is formed directly upon the fourth film layer. A sixth film layer comprising silicon nitride is positioned outwardly from the protective fifth film layer. A seventh film layer comprising an oxide of zinc is positioned outwardly from the sixth film layer. An eighth film layer comprising an infrared-reflective material is positioned outwardly from the seventh film layer. A protective ninth film layer is formed directly upon the eighth film layer. A tenth film layer comprising silicon nitride is positioned outwardly from the protective ninth film layer. Additional film layers can also be interposed beneath, among, and/or outside any of these film layers.

DETAILED DESCRIPTION OF PREFERRED EMBODIMENTS

Figure 1:
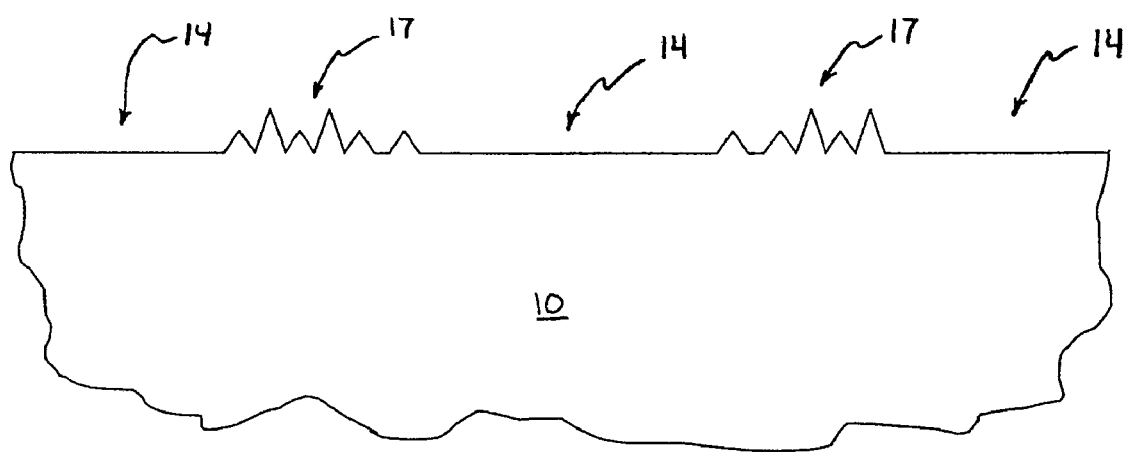
FIG. 1 is a schematic cross-sectional view of a corroded substrate.

The following detailed description is to be read with reference to the drawings, in which like elements in different drawings have been given like reference numerals. The drawings, which are not necessarily to scale, depict selected embodiments and are not intended to limit the scope of the invention. Skilled artisans will recognize that the examples provided herein have many suitable alternatives that can be utilized, and which fall within the scope of the invention.

The present invention provides thin film coatings having a transparent base layer. The transparent base layer is anticipated to have utility in a wide variety of coatings. For example, particular utility is anticipated for low-emissivity coatings, particularly silver-based low-emissivity coatings (i.e., low-emissivity coatings that include at least one silver-containing infrared-reflective film). Presently, it is contemplated that the base layer will bestow the greatest benefit upon heat-treatable low-emissivity coatings. For example, temperable low-emissivity coatings that are provided with the present base layer have been found to exhibit a surprising degree of resistance to the types of haze formation discussed above. Perhaps even more surprising is the thickness at which the present base layer provides this benefit, as is discussed below.

In certain embodiments, the transparent base layer does not have a substantial direct impact on the optical function of the film layers applied thereover. That is, the presence of the base layer itself in the final coated product may not have a substantial impact on the optical properties of the coated product. However, the base layer does impart resistance to deterioration (e.g., adverse change in optical properties) of the film stacks into which it is incorporated. For example, the present base layer has been found to impart in low-emissivity coatings surprising resistance to haze formation during heat treatment (e.g., tempering). In this manner, the transparent base layer can indirectly affect the optical properties of the coatings in which it is incorporated.

Thus, the base layer can be formed of material having an index of refraction that approximates that of the substrate to which it is applied. Preferably, the base layer is comprised of material with a refractive index that is equal to, or substantially the same as, that of the underlying substrate. In many cases, the substrate will be formed of material having an index of refraction of between about 1.35 and about 1.55, perhaps most often between about 1.4 and about 1.5. In these cases, the base layer may be formed of material with a refractive index of less than about 1.7. However, it is more preferable in these cases to form the base layer of material with a refractive index of between about 1.35 and about 1.55, or perhaps between about 1.4 and about 1.5.

In certain embodiments of the invention, the base layer 20 is an amorphous film. In many cases, it is believed to be advantageous to form the base layer of film that is as amorphous as possible. For example, a base layer of amorphous silicon dioxide is particularly preferred. An amorphous base layer of this nature can be deposited advantageously by sputtering, as described below. While a substantially amorphous film (e.g., silicon nitride) may be used in some embodiments, the base layer preferably is a substantially non-crystalline film. While silicon dioxide is described in detail as one preferred amorphous material, those skilled in the art may wish to select other amorphous materials to use as the base layer 20.

As noted above, the base layer comprises silicon dioxide in certain preferred embodiments of the invention. Silicon dioxide typically has a refractive index of about 1.4. Of course, other materials having a refractive index of between about 1.35–1.55, or more preferably between about 1.4–1.5, could be used as well. For example, those skilled in the art may select other materials with suitable refractive indexes. However, regardless of the material selected, the base layer is preferably formed of substantially non-porous material. Moreover, the base layer is preferably formed of material that adheres well to the desired substrate.

A variety of substrates are suitable for use in the present invention. In most cases, the substrate is a sheet of transparent material (i.e., a transparent sheet). In these cases, the base layer is desirably a thin transparent film. Of course, the substrate is not strictly required to be transparent. For example, opaque substrates may be useful in some cases. However, it is anticipated that for most applications, the substrate will comprise a transparent or translucent material, such as glass or clear plastic.

The present base layer is perhaps most advantageous when used in conjunction with a substrate that is vulnerable to being corroded (e.g., by exposure to moisture). For example, the substrate may be a glass pane. A variety of glass types can be used, although soda lime glass is perhaps the most preferred. Soda lime glass typically has a refractive index of between about 1.4 and about 1.5.

The base layer is preferably deposited directly upon a surface of the substrate. As noted above, it is anticipated that soda lime glass will be a preferred substrate for many applications. It is well known that soda lime glass is formed largely of silicon dioxide. Thus, in certain preferred embodiments, a base layer of silicon dioxide is applied directly upon a sheet of soda lime glass. In embodiments of this nature, the resulting bond between the silicon dioxide and the glass is believed to be exceptionally strong. Accordingly, silicon dioxide is a particularly preferred base layer material, as it is unlikely to delaminate from the substrate during subsequent processing or use.

In certain particularly advantageous embodiments, a layer of silicon nitride is applied directly over a base layer 20 of silicon dioxide, while a layer of pure zinc oxide is positioned directly over this silicon nitride layer and directly beneath an overlying infrared-reflective layer 50 of silver. These embodiments are particularly desirable in that the base layer and the film directly over the base layer both are silicon-based and amorphous. Further, the pure ZnO directly beneath the silver layer promotes the growth of high quality silver. In these embodiments, the thickness of the silicon nitride preferably is less than about 230 Å, more preferably less than about 180 Å, and perhaps optimally less than about 160 Å. These thicknesses are particularly preferred to achieve strong adhesion of the silicon nitride to the silicon dioxide.

The transparent base layer 20 desirably has a thickness of at least about 50 angstroms. For example, the base layer 20 may have a thickness of between about 50 angstroms and about 90 angstroms. Particularly good results have been achieved using silicon dioxide base layers at these thickness ranges. Since the refractive index of the transparent base layer is approximately the same as that of the substrate, the base layer can be incorporated into a film stack on the substrate at essentially any thickness without substantially changing the visible transmission, reflection, or color of the coated substrate. As a consequence, this layer 20 has no strict maximum thickness.

However, it is time and cost effective to minimize the thickness of the base layer. This is especially true in cases where the base layer 20 is formed of sputtered silicon dioxide (due to the slow sputter rate of silicon dioxide). Providing a thick sputtered silicon dioxide base layer would take an unacceptable amount of process time and would require either an unacceptably large number of sputtering chambers (i.e., an unacceptably long sputtering line) or an unacceptably slow substrate speed (which would have an unacceptable effect on throughput). Further, the stress in the base layer 20 will typically increase as the thickness of this layer 20 is increased. While this may be less important when the base layer 20 is formed of sputtered silicon dioxide (since sputtered silicon dioxide tends not to have particularly high stress), some advantage in the way of low stress may be gained by minimizing thickness. Surprisingly, good results have been achieved using a transparent base layer 20 with a thickness of less than 100 angstroms, and even with a thickness of less than about 90 angstroms (e.g., about 70 angstroms). Base layers 20 of silicon dioxide, for example, have given good results at these thicknesses.

In certain particularly advantageous embodiments, the transparent base layer 20 is a sputtered film. Sputtered films have exceptional smoothness and thickness uniformity. Both of these qualities are highly desirable for avoiding haze in heat-treatable silver-based coatings. In particular, the low surface roughness of a sputtered base layer promotes particularly good thickness uniformity in the overlying films. Thickness uniformity is particularly desirable for protective layers 80, 180, if haze is to be minimized. Sputtered silicon dioxide base layers are particularly advantageously as they tend to have a very desirable amorphous structure. Sputtering techniques and equipment are well known in the art. For example, magnetron sputtering chambers and related equipment are commercially available from a variety of sources (e.g., Leybold and BOC Coating Technology). Useful magnetron sputtering techniques and equipment are also disclosed in U.S. Pat. No. 4,166,018, issued to Chapin, the entire teachings of which are incorporated herein by reference.

Conventional magnetron sputtering techniques and equipment can be used to apply the transparent base layer 20. As noted above, the base layer 20 can be formed advantageously of silicon dioxide. For example, this layer 20 could be deposited by sputtering silicon dioxide targets in an inert atmosphere. However, it can be extremely difficult to reliably sputter silicon dioxide targets. This is because targets serve as cathodes in conventional magnetron sputtering processes and because silicon dioxide is a poor conductor. As a result, it is preferable to deposit silicon dioxide using targets comprising metallic silicon rather than silicon dioxide. The material actually deposited on the substrate can be converted to silicon dioxide by employing a sputtering atmosphere that includes oxygen.

The silicon targets are preferably not formed of pure silicon. Rather, the targets more preferably comprise a compound of silicon and aluminum or another electrically-conductive material. Pure silicon targets are difficult to sputter in a consistent, controlled fashion because silicon is a semiconductor. As a consequence, some of the silicon dioxide (which is non-conductive) that is emitted when sputtering pure silicon targets is re-deposited on the target surfaces, as well as on the anodes and surrounding shields in the sputtering chamber. This can affect the flow of current, which in turn may cause arcing if sputtering is continued. Thus, to reduce arcing, it is preferred that the targets include between about 5% and about 15% aluminum, or another electrically conductive material. Silicon-aluminum targets are available from a number of well known commercial suppliers, such as Bekaert VDS nv, which is located in Deinze, Belgium.

The atmosphere in the sputtering chamber can be varied to achieve an optimized sputtering rate. An oxidizing sputtering atmosphere is preferably employed in cases where silicon or silicon-aluminum targets are used. Of course, the sputtering atmosphere need not be pure oxygen in these cases. To the contrary, a mixture of oxygen and inert gas (e.g., argon) will tend to enhance the sputtering rate. For example, it is believed that a sputtering atmosphere comprising oxygen and up to about 40% argon (preferably 0–20% argon) maintained at about $3 \times 10^{-3}$ mbar will suffice. The power applied to each target is preferably optimized to reduce arcing yet maximize sputtering rate. Power levels of up to about 80 kW per target are expected to yield good results.

One manufacturing arrangement that has given good results employs three rotary sputtering targets of silicon doped with about 5–15% aluminum (i.e., between about 95% silicon/about 5% aluminum and about 85% silicon/about 15% aluminum) with a power of about 42 kW applied to each target. The atmosphere in the sputtering chamber may comprise 100% $O_2$ at a pressure of about 2.5–4.5 mTorr. Alternatively, an atmosphere comprising about 80% oxygen and about 20% argon maintained at about $3 \times 10^{-3}$ mbar can be used. The substrate can be moved past the sputtering targets at about 100–500 inches per minute. Of course, the precise operating conditions (e.g., substrate speed, power, plasma composition, target composition, etc.) under which a silicon dioxide base layer 20 is applied can be varied as desired to optimize deposition of this layer 20 at different thicknesses. Given the present teaching as a guide, one of ordinary skill in the art would be able to readily select and vary suitable operating conditions to apply a silicon dioxide base layer at different thicknesses.

Thus, in a preferred method of the invention, a silicon dioxide base layer is deposited by moving a substrate 10 beneath a plurality of silicon-aluminum targets while sputtering the targets in an oxidizing atmosphere. If so desired, this atmosphere may consist essentially of oxygen and inert gas. While this is by no means a requirement, sputtering atmospheres of this nature have given good results. A base layer 20 deposited by such a method would be expected to consist essentially of silicon dioxide and a small amount of aluminum (or another metal provided in the targets to enhance their conductivity), at least when initially deposited.

Figure 2:
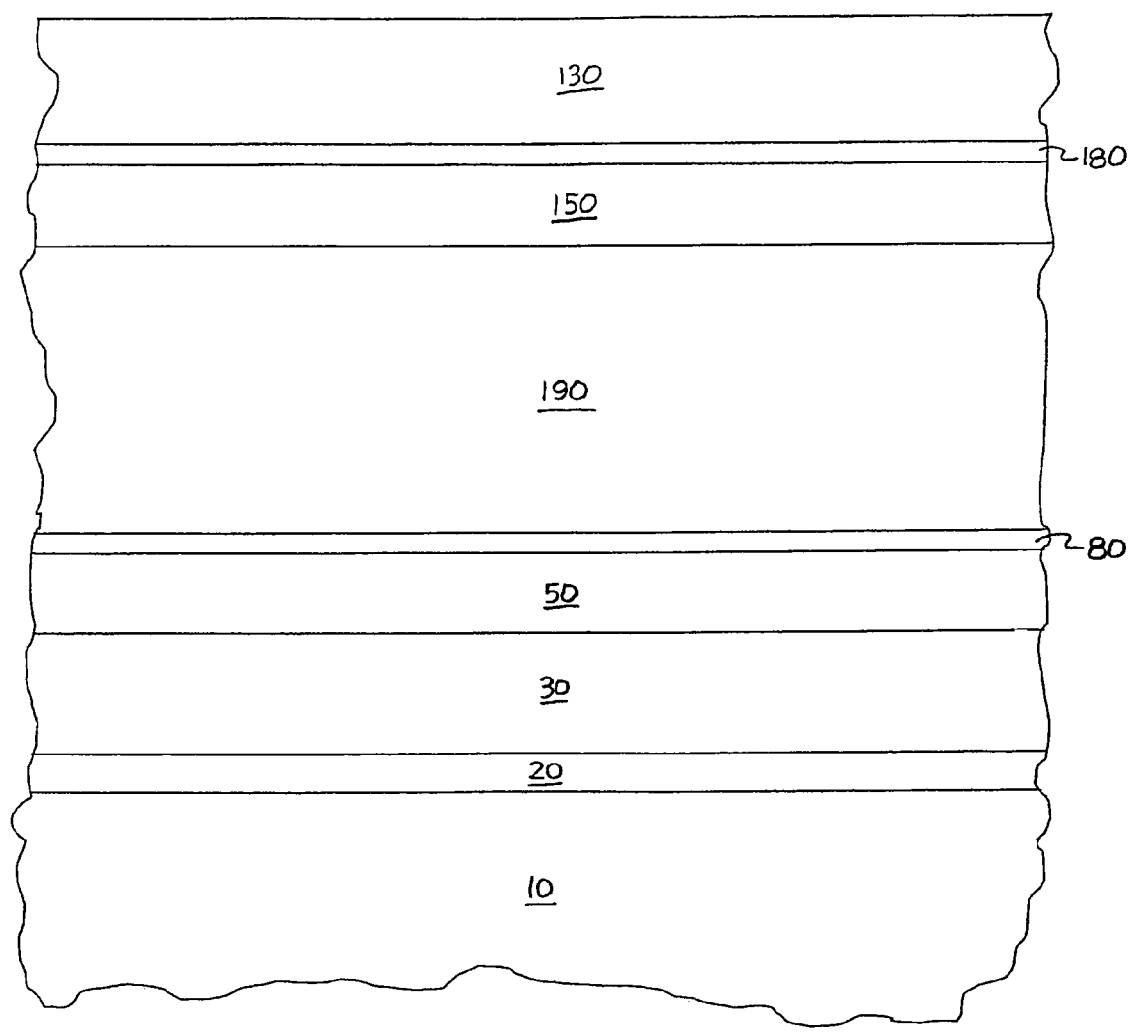
FIG. 2 is a schematic cross-sectional view of one embodiment of a film stack in accordance with the invention.

FIG. 2 depicts a particularly preferred coating of the invention. The illustrated embodiment involves a low-emissivity coating with two infrared-reflective layers 50, 150. As low-emissivity coatings are well known in the present art, those skilled in this art would be able to readily select and vary the precise nature (e.g., composition, thickness, and deposition parameters) of the various films in these coatings. Therefore, it should be appreciated that the low-emissivity film stack embodiments described below and illustrated in FIGS. 2–6 are merely exemplary. It should also be appreciated that the present invention extends to any low-emissivity coating having a transparent base layer of the nature described above.

In the film stack depicted in FIG. 2, the transparent base layer 20 is formed directly upon the illustrated substrate 10. Upon the base layer 20 is deposited a second layer 30, which may include one or more transparent dielectric films. It is to be understood that the term "transparent dielectric" is used herein to refer to any non-metallic material that includes any one or more metals and is substantially transparent when applied as a thin film having a thickness of the magnitude described herein. For example, included in this definition would be any metal oxide, metal nitride, metal carbide, metal sulfide, metal boride, and any combinations thereof. Further, the term "metal" should be understood to include all metals and semi-metals (i.e., metalloids).

With continued reference to FIG. 2, the second layer 30 may comprise one or more transparent dielectric materials. For example, a wide variety of metal oxides may be used, including oxides of zinc, tin, indium, bismuth, titanium, hafnium, zirconium, and alloys and mixtures thereof. While oxides are advantageous due to their ease and low cost of application, metal nitrides (e.g., silicon nitride) can also be used quite advantageously. For example, in one preferred embodiment, the second layer 30 comprises silicon nitride deposited directly upon a silicon dioxide base layer. In this embodiment, a layer of pure zinc oxide (i.e., an oxide of zinc alone) is preferably positioned further from the substrate than the third layer 30 and directly beneath/contiguous with an overlying infrared-reflective film.

If the second layer 30 consists of a single film, then such film is preferably formed of zinc oxide. For example, in one embodiment, this layer 30 comprises zinc oxide applied at a thickness of between about 100 Å and about 400 Å, more preferably between about 100 Å and about 275 Å, and perhaps optimally about 230 Å. While the second layer 30 is shown in FIG. 2 as being a single film, it can be replaced with two or more transparent dielectric films, which films may optionally be formed of different transparent dielectric materials. Whether this layer 30 consists of one film or multiple films, it may be preferable to limit each individual film to a physical thickness of less than about 250 Å or an optical thickness of no more than about 450 Å, for purposes that will be discussed below with reference to films in the intermediate region 190 (i.e., the region between the two infrared-reflective layers 50, 150) of the film stack.

As has been described, the composition of the second layer 30 can be varied as desired. However, it is generally preferred that at least a thin film of zinc oxide be applied as the outermost portion (i.e., the portion of this layer farthest away from the substrate) of the second layer 30. This is believed to enhance the quality of the film stack, at least if a silver infrared-reflective layer 50 is subsequently applied, since zinc oxide is thought to provide a good foundation for the nucleation of silver. Thus, it is preferable either to form the whole of the second layer 30 of zinc oxide or to replace this layer 30 with two or more films (not shown), wherein the outermost film is zinc oxide.

Thus, it is contemplated that the second layer 30 will be replaced with two films in certain embodiments (not shown). For example, the first film (i.e., the film directly upon the transparent base layer 20) may be an alloy or mixture of zinc oxide, such as an alloy or mixture of zinc oxide and bismuth oxide, tin oxide, or indium oxide. As connoted above, the second film is preferably an oxide of zinc alone, at least if the overlying infrared-reflective film 50 comprises silver. Six suitable embodiments of this nature involve: (1) a first film having a thickness of between about 80 angstroms and about 100 angstroms, perhaps optimally about 90 angstroms, and a second film having a thickness of between about 35 angstroms and about 45 angstroms, perhaps optimally about 40 angstroms; (2) a first film having a thickness of between about 75 angstroms and about 95 angstroms, perhaps optimally about 85 angstroms, and a second film having a thickness of between about 50 angstroms and about 60 angstroms, perhaps optimally about 55 angstroms; (3) a first film having a thickness of between about 60 angstroms and about 80 angstroms, perhaps optimally about 70 angstroms, and a second film having a thickness of between about 52 angstroms and about 62 angstroms, perhaps optimally about 57 angstroms; (4) a first film having a thickness of between about 95 angstroms and about 115 angstroms, perhaps optimally about 105 angstroms, and a second film having a thickness of between about 40 angstroms and about 50 angstroms, perhaps optimally about 45 angstroms; (5) a first film having a thickness of between about 80 angstroms and about 100 angstroms, perhaps optimally about 90 angstroms, and a second film having a thickness of between about 38 angstroms and about 48 angstroms, perhaps optimally about 43 angstroms; and (6) a first film having a thickness of between about 147 angstroms and about 167 angstroms, perhaps optimally about 157 angstroms, and a second film having a thickness of between about 66 angstroms and about 76 angstroms, perhaps optimally about 71 angstroms.

The third layer 50 depicted in FIG. 2 desirably comprises infrared-reflective material. This infrared-reflective material is preferably applied directly upon the second layer 30. In other words, this infrared-reflective layer 50 is preferably contiguous to (i.e., in direct physical contact with) the second layer 30. Any suitable infrared-reflective material can be selected for use in this layer 50. As noted above, silver is the most commonly used infrared-reflective material. However, gold, copper, or any other infrared-reflective material can be used. Likewise, alloys or mixtures of these materials can be used. In most cases, it will be preferable to employ a silver or silver-containing layer 50. The term "silver-containing" is used herein to refer to any film that includes at least some silver. For example, one may provide an infrared-reflective layer in the form of silver combined with a small amount of gold (e.g., about 5% gold or less). In a particularly preferred embodiment, this layer 50 comprises silver at a thickness of between about 50 Å and about 150 Å, more preferably between about 58 Å and about 90 Å, and perhaps optimally about 80 Å.

As suggested above, a protective layer 80 is desirably applied directly upon the infrared-reflective layer 50. This layer 80 may be provided to protect the infrared-reflective layer 50 from chemical attack. For example, the protective layer 80 may provide resistance to deterioration of the reflective layer 50 during deposition of subsequent layers and during heat treatment. Thus, while the protective layer 80 may be omitted in certain embodiments, its presence will generally be preferred in most film stacks that are sputter deposited or heat treated. An additional or alternative purpose for the protective layer 80 may be to enhance adhesion of the next applied film to the underlying infrared-reflective layer 50 (or it may be provided as a stress-reducing layer).

The protective layer 80 may comprise material that is readily oxidized or nitrided. For example, this layer 80 can be deposited as a thin layer of metallic titanium. The majority of the titanium metal may then be converted to a titanium oxide and/or nitride of varying stoichiometry during deposition of subsequent layers of the film stack and/or during subsequent heat treatment. If so desired, the protective layer may alternatively comprise nickel, chromium, or an alloy thereof (e.g., nichrome). Protective layers of this nature may advantageously enhance adhesion of the next applied film to the underlying infrared-reflective layer 50. Protective layers comprising nickel and chromium are taught in U.S. Pat. No. 5,344,718 (Hartig et al.), the entire teachings of which are incorporated herein by reference.

In certain particularly preferred embodiments, the protective layer 80 is deposited as metallic niobium. The majority of the niobium metal may then be converted to a niobium oxide and/or nitride of varying stoichiometry during deposition of subsequent layers of the film stack and/or during subsequent heat treatment. Niobium-containing protective layers are particularly advantageous when incorporated into low-emissivity coatings that are destined to be heat-treated (e.g., tempered). The term "niobium-containing" is used herein to refer to a film that includes at least some niobium. For example, low-emissivity coatings with protective films comprising niobium have been found to exhibit significantly less color change when subjected to glass tempering than otherwise equivalent coatings with protective films comprising titanium.

Further, the inventors have discovered that providing low-emissivity coatings with a combination of the present transparent base layer 20 and one or more protective niobium-containing films 80, 180 yields coatings that are exceptionally well suited for elevated temperature processing (e.g., tempering). In fact, low-emissivity coatings with this combination of features have been found to exhibit virtually no noticeable color shift and minimal haze formation when subjected to temperatures on the order of about 700 degrees C. In these embodiments, particularly good results have been achieved by providing each niobium-containing protective layer at a thickness of about 15–22 Å, notably when provided in combination with a base layer of sputtered silicon dioxide, and most notably when such sputtered silicon dioxide layer has a thickness below 100 Å.

Thus, the optional protective layer 80 is advantageously comprised of a material selected from the group consisting of titanium, niobium, nickel, and chromium. Regardless of the material from which the protective layer 80 is formed, this layer 80 (if present) is preferably deposited at a thickness sufficient to protect the infrared-reflective layer 50 from being degraded during the deposition of subsequent layers and during any subsequent heat treatment. The thickness range at which the protective layer 80 is preferably applied is about 7–30 Å, more preferably about 15–22 Å, and perhaps optimally about 20 Å. An additional sacrificial layer (not shown) can be provided directly beneath the infrared-reflective layer 50, if so desired.

With continued reference to FIG. 2, an intermediate film region 190 is positioned outwardly from (i.e., further from the substrate than) the first infrared-reflective layer 50 (e.g., directly upon the protective layer 80, if present). In its simplest form, this intermediate film region 190 consists of a single layer of any desired transparent dielectric material. For example, an intermediate zinc oxide or silicon nitride layer with a thickness in the range of about 400–1200 Å can be deposited on the protective layer 80. Alternatively, two separate transparent dielectric films (not shown) can be deposited between the optional protective layer 80 and the second infrared-reflective layer 150. These two films would preferably have a combined thickness of about 400–1200 Å. In one embodiment of this nature, the intermediate region 190 is formed of a silicon nitride film and a zinc oxide film. In this embodiment, the zinc oxide is preferably applied over (i.e., outwardly from) the silicon nitride. Suitable thicknesses for these films include about 500 angstroms and about 40 angstroms, respectively.

It is particularly preferred to form the intermediate film region 190 of a plurality of discrete layers. For example, forming the intermediate film region 190 of discrete multiple layers is desirable to minimize haze formation during tempering. This is discussed in International Application Number PCT/US00/42434, entitled "Haze Resistant Transparent Film Stacks", the entire teachings of which are incorporated herein by reference. It is preferable to limit each layer of the intermediate film region 190 to a physical thickness of no more than about 250 Å, or more preferably to no more than about 225 Å, and perhaps optimally below 200 Å (e.g., below about 180 Å). Moreover, it is believed to be advantageous if each layer in the intermediate film region 190 is formed of a different material than each layer contiguous thereto. This is believed to reduce the likelihood that objectionable haze will develop in the film stack during heat treatment. In one particular embodiment, each of the intermediate films has a physical thickness of less than 200 angstroms. In this embodiment, it is preferable if at least one of the intermediate films is silicon nitride.

In one embodiment, the intermediate layer includes at least one amorphous or substantially amorphous material (e.g., silicon nitride). Materials of this nature are advantageous in that they tend not to experience major crystal growth when tempered or otherwise heat treated. As a consequence, they tend not to develop objectionable haze during heat treatment. One preferred embodiment includes an intermediate film region comprising silicon nitride. Preferably, this silicon nitride is broken up into two or more discrete silicon nitride films, separated from one another by film of a material other than silicon nitride. This is believed to be advantageous, since silicon nitride tends to have significant stress, and since this stress may become more problematic as the thickness of the silicon nitride is increased. Thus, it may be desirable to provide an intermediate film region that comprises a plurality of discrete silicon nitride films each having an individual thickness of less than about 250 angstroms, more preferably less than about 225 angstroms, and perhaps optimally less than 200 angstroms. These silicon nitride films may be separated, for example, by one or more oxide layers (e.g., zinc oxide, tin oxide, etc.).

The number of layers in the intermediate region 190 can be varied as desired. However, it is believed to be preferable to form this region 190 of at least three separate layers. In certain embodiments, the intermediate film region includes a silicon nitride film positioned between two zinc oxide films. For example, one embodiment (not shown) provides an intermediate film region 190 comprising, moving outwardly from the protective layer 80: (1) zinc oxide at a thickness of about 150–250 Å, perhaps optimally about 220 Å; (2) silicon nitride at a thickness of about 40–120 Å, perhaps optimally about 80–100 Å; and (3) zinc oxide at a thickness of about 150–250 Å, perhaps optimally about 210 Å. It is believed to be even more preferable to form the intermediate film region 190 of at least five separate layers, as will now be discussed.

Figure 3:
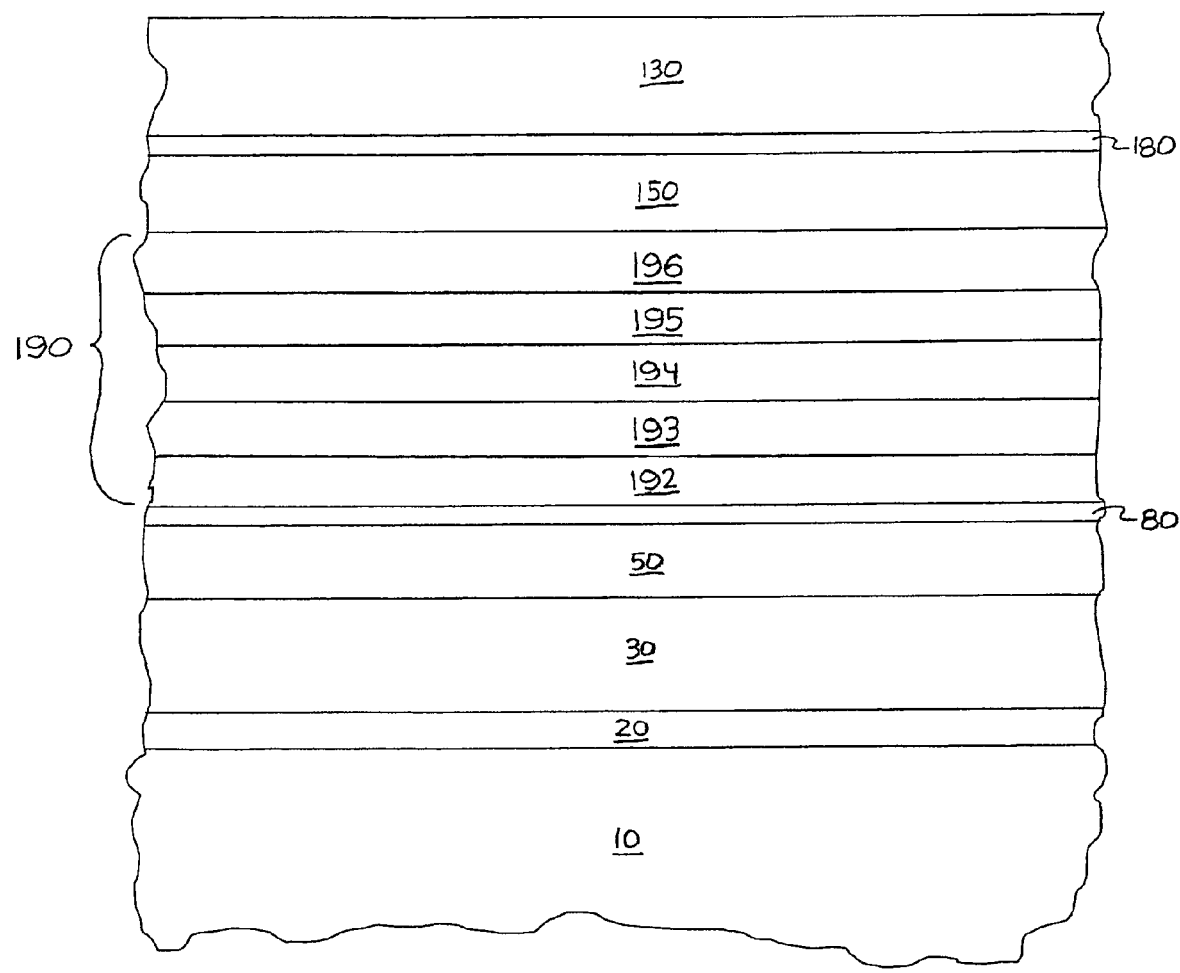
FIG. 3 is a schematic cross-sectional view of another embodiment of a film stack in accordance with the invention.

FIG. 3 illustrates an embodiment wherein the intermediate film region 190 includes five separate layers. In this embodiment, for example, alternating intermediate layers of zinc oxide and silicon nitride can be provided (e.g., three layers of zinc oxide and two layers of silicon nitride, or three layers of silicon nitride and two layers of zinc oxide). The intermediate film region 190 in the embodiment of FIG. 3 includes a first layer 192, a second layer 193, a third layer 194, a fourth layer 195, and a fifth layer 196. As described in the above-noted International Application, it may be preferable to form the intermediate film region 190 of an odd number of intermediate layers such that the bottom 192 and top 196 layers of this region 190 comprise the same material. For example, the first 192 and fifth 196 intermediate films in the embodiment of FIG. 3 can both be formed of the same material (e.g., zinc oxide). As is also described in the above-noted International Application, each layer in the intermediate film region 190 preferably has a different microstructure than each layer contiguous thereto, preferably by forming contiguous layers of different materials. For example, excellent results have been achieved using an intermediate film region 190 comprising alternating layers of zinc oxide 192, 194, 196 and silicon nitride 193, 195.

In one preferred embodiment, the intermediate film region 190 comprises the following films: (1) a first layer 192 of zinc oxide at a thickness of about 50–200 Å, perhaps optimally about 105 Å; (2) a second layer 193 of silicon nitride at a thickness of about 50–200 Å, perhaps optimally about 140 Å; (3) a third layer 194 of zinc oxide at a thickness of about 50–300 Å, perhaps optimally about 200 Å; (4) a fourth layer 195 of silicon nitride at a thickness of about 50–200 Å, perhaps optimally about 140 Å; and (5) a fifth layer 196 of zinc oxide at a thickness of about 50–200 Å, perhaps optimally about 80 Å. If so desired, any one or more of the zinc oxide layers can be formed of an alloy or mixture comprising zinc oxide, such as a mixture of zinc oxide and bismuth oxide, tin oxide, or indium oxide. However, it is preferable to form at least the outermost region of the fifth layer 196 of zinc oxide since, as noted above, zinc oxide is believed to provide a good foundation for the nucleation of silver (which may be deposited directly upon the fifth layer). For example, the fifth layer 196 in this embodiment may be formed of a first oxide film having a thickness of about 20 Å, such as an oxide of zinc alloy, and a second film of an oxide of zinc alone at a thickness of about 60 Å.

In another preferred embodiment, the intermediate film region 190 comprises the following films: (1) a first layer 192 of zinc oxide at a thickness of about 95–115 Å, perhaps optimally about 105 Å; (2) a second layer 193 of silicon nitride at a thickness of about 101–141 Å, perhaps optimally about 121 Å; (3) a third layer 194 of zinc oxide at a thickness of about 180–220 Å, perhaps optimally about 200 Å; (4) a fourth layer 195 of silicon nitride at a thickness of about 101–141 Å, perhaps optimally about 121 Å; and (5) a fifth layer 196 of zinc oxide at a thickness of about 90–120 Å, perhaps optimally about 105 Å. As noted above, any one or more of the zinc oxide layers can be formed of an alloy or mixture comprising zinc oxide, though, it is preferable to form at least the outermost region of the fifth film 196 of pure zinc oxide. For example, the fifth layer 196 in this embodiment may be formed of a first oxide film having a thickness of about 60 Å, such as an oxide of zinc alloy, and a second film of an oxide of zinc alone at a thickness of about 45 Å.

In still another preferred embodiment, the intermediate film region 190 comprises the following films: (1) a first layer 192 of zinc oxide at a thickness of about 95–115 Å, perhaps optimally about 105 Å; (2) a second layer 193 of silicon nitride at a thickness of about 104–144 Å, perhaps optimally about 124 Å; (3) a third layer 194 of zinc oxide at a thickness of about 155–195 Å, perhaps optimally about 175 Å; (4) a fourth layer 195 of silicon nitride at a thickness of about 104–144 Å, perhaps optimally about 124 Å; and (5) a fifth layer 196 of zinc oxide at a thickness of about 88–118 Å, perhaps optimally about 103 Å. As with the two preceding embodiments, any one or more of the zinc oxide layers can be formed of an alloy or mixture comprising zinc oxide, with at least the outermost region of the fifth film 196 preferably being formed of pure zinc oxide. For example, the fifth layer 196 in this embodiment may be formed of a first oxide film having a thickness of about 53 Å, such as an oxide of zinc alloy, and a second film of an oxide of zinc alone at a thickness of about 50 Å.

In yet another preferred embodiment, the intermediate film region 190 comprises the following films: (1) a first layer 192 of zinc oxide at a thickness of about 125–145 Å, perhaps optimally about 135 Å; (2) a second layer 193 of silicon nitride at a thickness of about 134–174 Å, perhaps optimally about 154 Å; (3) a third layer 194 of zinc oxide at a thickness of about 137–177 Å, perhaps optimally about 157 Å; (4) a fourth layer 195 of silicon nitride at a thickness of about 131–171 Å, perhaps optimally about 151 Å; and (5) a fifth layer 196 of zinc oxide at a thickness of about 105–135 Å, perhaps optimally about 120 Å. Here again, any one or more of the zinc oxide layers can be formed of an alloy or mixture comprising zinc oxide, with at least the outermost region of the fifth film 196 preferably being formed of pure zinc oxide. For example, the fifth layer 196 in this embodiment may be formed of a first oxide film having a thickness of about 64 Å, such as an oxide of zinc alloy, and a second film of an oxide of zinc alone at a thickness of about 56 Å.

In still another preferred embodiment, the intermediate film region 190 comprises the following films: (1) a first layer 192 of zinc oxide at a thickness of about 90–110 Å, perhaps optimally about 100 Å; (2) a second layer 193 of silicon nitride at a thickness of about 102–142 Å, perhaps optimally about 122 Å; (3) a third layer 194 of zinc oxide at a thickness of about 180–220 Å, perhaps optimally about 200 Å; (4) a fourth layer 195 of silicon nitride at a thickness of about 110–150 Å, perhaps optimally about 130 Å; and (5) a fifth layer 196 of zinc oxide at a thickness of about 100–130 Å, perhaps optimally about 115 Å. Again, any one or more of the zinc oxide layers can be formed of an alloy or mixture comprising zinc oxide, with at least the outermost region of the fifth film 196 preferably being formed of pure zinc oxide. For example, the fifth layer 196 in this embodiment may be formed of a first oxide film having a thickness of about 65 Å, such as an oxide of zinc alloy, and a second film of an oxide of zinc alone at a thickness of about 50 Å.

In yet another preferred embodiment, the intermediate film region 190 comprises the following films: (1) a first layer 192 of zinc oxide at a thickness of about 111–131 Å, perhaps optimally about 121 Å; (2) a second layer 193 of silicon nitride at a thickness of about 110–150 Å, perhaps optimally about 130 Å; (3) a third layer 194 of zinc oxide at a thickness of about 180–220 Å, perhaps optimally about 200 Å; (4) a fourth layer 195 of silicon nitride at a thickness of about 102–142 Å, perhaps optimally about 122 Å; and (5) a fifth layer 196 of zinc oxide at a thickness of about 100–130 Å, perhaps optimally about 115 Å. Any one or more of the zinc oxide layers can be formed of an alloy or mixture comprising zinc oxide, with at least the outermost region of the fifth film 196 preferably being formed of pure zinc oxide. For example, the fifth layer 196 in this embodiment may be formed of a first oxide film having a thickness of about 65 Å, such as an oxide of zinc alloy, and a second film of an oxide of zinc alone at a thickness of about 50 Å.

In a further preferred embodiment, the intermediate film region 190 comprises the following films: (1) a first layer 192 of zinc oxide at a thickness of about 96–116 Å, perhaps optimally about 106 Å; (2) a second layer 193 of silicon nitride at a thickness of about 117–157 Å, perhaps optimally about 137 Å; (3) a third layer 194 of zinc oxide at a thickness of about 183–223 Å, perhaps optimally about 203 Å; (4) a fourth layer 195 of silicon nitride at a thickness of about 117–157 Å, perhaps optimally about 137 Å; and (5) a fifth layer 196 of zinc oxide at a thickness of about 64–94 Å, perhaps optimally about 79 Å. Any one or more of the zinc oxide layers can be formed of an alloy or mixture comprising zinc oxide, with at least the outermost region of the fifth film 196 preferably being formed of pure zinc oxide. For example, the fifth layer 196 in this embodiment may be formed of a first oxide film having a thickness of about 17 Å, such as an oxide of zinc alloy, and a second film of an oxide of zinc alone at a thickness of about 62 Å.

The inventors have discovered that an exceptional coating can be achieved by providing a low-emissivity film stack with a combination of the present transparent base layer 20 and an intermediate film region 190 comprising at least three, and preferably at least five, discrete transparent dielectric layers (optimally limited in thickness and having each layer formed of a different material than each layer contiguous thereto, as described above). Low-emissivity coatings with this combination of features have been found to exhibit virtually no noticeable haze formation even when subjected to elevated temperatures on the order of about 700 degrees C. Coatings with this combination of features have also been found to perform exceptionally well under "adhesion failure with moisture" testing, as will now be described.

The assignee of the present invention has developed a particularly rigorous "adhesion failure with moisture" test for evaluating the adhesion of a coating. In this test, a glass lite bearing the desired coating is positioned in a washer adapted for flat glass washing. The glass is positioned in the washer such that the coated glass surface is oriented upwardly toward a brush that is adapted to act directly upon the coated surface of the glass. During testing, this brush is rotated and positioned over the coated glass surface, such that the bristles of the rotating brush are in direct dynamic physical contact with the coated surface. The rotating brush is held in contact with the coated surface for a period of 20 seconds. The glass lite is then removed from the washer, and the coated surface is checked for damage.

The assignee of the present invention has also developed the following 1–5 scale for rating any damage to the coating following testing. The coating is rated a "1" if it shows no visible damage following testing. On the other end of the scale, the coating is rated a "5" if there is total (i.e., complete) coating removal in the area under the brush. The coating is rated a "2" if there are only fine (i.e., trifling) scratches that are not continuous. The coating is rated a "3" if there is some adhesion failure (i.e., visible loss of coating in some areas) in addition to scratches. The coating is rated a "4" if the damage approaches total failure (i.e., total removal of coating in the area of the brush), yet some areas beneath the brush still retain coating.

As noted above, coatings with the present combination of features (i.e., having the present base layer 20 and an intermediate film region 190 comprising a plurality of discrete transparent dielectric layers, as described above) have performed exceptionally well under the above "adhesion failure with moisture" test. These coatings have been found to consistently score 1 ratings, indicating excellent adhesion to the glass. Thus, coatings with this combination of features achieve desirable temperability in combination with excellent substrate adhesion.

In certain particularly preferred embodiments, the invention provides a low-emissivity coating with a combination of the present transparent base layer 20, an intermediate film region 190 comprising discrete multiple transparent dielectric layers (as described above), and one or more protective niobium-containing films 80, 180. Coatings having this unique combination of features have been found to perform exceptionally well under the above "adhesion failure with moisture" test. They also have been found to exhibit virtually no noticeable color shift or haze formation even when subjected to elevated temperatures on the order of about 700 degrees C. Therefore, coatings of this nature are particularly preferred.

FIGS. 2–5 depict "double-silver" type low-emissivity coatings. Coatings of this nature characteristically include two infrared-reflective layers 50, 150 between which is positioned an intermediate film region 190, as described above. In each of these figures, the second infrared-reflective layer 150 is contiguous to the intermediate region 190. However, this is not a requirement. For example, a protective layer of the nature described above can be interposed between the intermediate region 190 and the second infrared-reflective layer 150. However, this may be less preferred, as providing a layer of zinc oxide immediately beneath a layer of silver has been found to promote growth of a high quality silver film.

The materials that are useful in forming the first infrared-reflective layer 50 are also useful in forming the second infrared-reflective layer 150. It is anticipated that both of these infrared-reflective layers will be formed of the same material, although this is not a requirement. Preferably, both layers 50, 150 are silver or silver-containing films, with the second, outer layer 150 being somewhat thicker than the first, inner layer 50. For example, a preferred embodiment provides a first infrared-reflective layer 50 of silver at a thickness of between about 50 Å and about 150 Å, more preferably between about 58 Å and about 90 Å, perhaps optimally about 80 Å, and a second infrared-reflective layer 150 of silver at a thickness of between about 90 Å and about 180 Å, more preferably between about 96 Å and about 155 Å, perhaps optimally at about 130 Å.

A second protective layer 180 is preferably provided over the second infrared-reflective layer 150. As described above, this layer 180 can be advantageously formed of titanium, niobium, nickel, chromium, nichrome, or the like. Like the inner protective layer 80, suitable deposition thicknesses for the outer protective layer 180 range from 7–30 Å, more preferably between 15–22 Å, and perhaps optimally about 20 Å. Particularly good results have been obtained where both protective layers 80, 180 are niobium-containing films each deposited at a thickness of about 15–22 Å. An additional protective layer (not shown) can be provided directly beneath the second infrared-reflective layer 150, if so desired. Alternatively, one or both of the protective layers 80, 180 may be omitted entirely, although this will generally be less preferred.

With continued reference to FIGS. 2–6, an outer film region 130 is positioned outwardly from the second infrared-reflective layer 150 (e.g., directly upon the protective layer 180, if present). The exact nature of the outer film region 130 can be varied as desired. In its simplest form, this outer film region 130 consists of a single transparent dielectric film. A wide variety metal nitrides (e.g., silicon nitride) and metal oxides (e.g., oxides of zinc, tin, indium, bismuth, titanium, hafnium, zirconium, and alloys and mixtures thereof) can be used as the outermost layer of a low-emissivity coating. Preferably, a durable material is used when the outermost film region 130 comprises a single layer. For example, one embodiment employs an outer film region 130 of silicon nitride, which offers good chemical durability, applied at a thickness of between about 100 Å and about 400 Å, more preferably between about 100 Å and about 300 Å, and perhaps optimally about 280 Å. Those skilled in the art would be able to readily select other materials that would be suitable for use as the outermost layer 130 of a low-emissivity film stack.

It may be preferable to employ an outer film region 130 comprising a plurality of separate layers. For example, a variety of film stacks are well known by those skilled in the art to be suitable for use as the outermost region 130 of a low-emissivity film stack. In certain embodiments, the outermost region 130 of a low-emissivity film stack includes a titanium nitride layer. It may be preferable to limit each layer of the outer film region 130 to a physical thickness of no more than about 250 Å, or more preferably to no more than about 225 Å, or to an optical thickness of no more than about 450 Å. Moreover, it is believed to be advantageous if each layer in the outer film region 130 is formed of a different material than each layer contiguous thereto. As noted above in connection with the intermediate film region 190, this is believed to reduce the likelihood that objectionable haze will develop during heat treatment.

Figure 4:
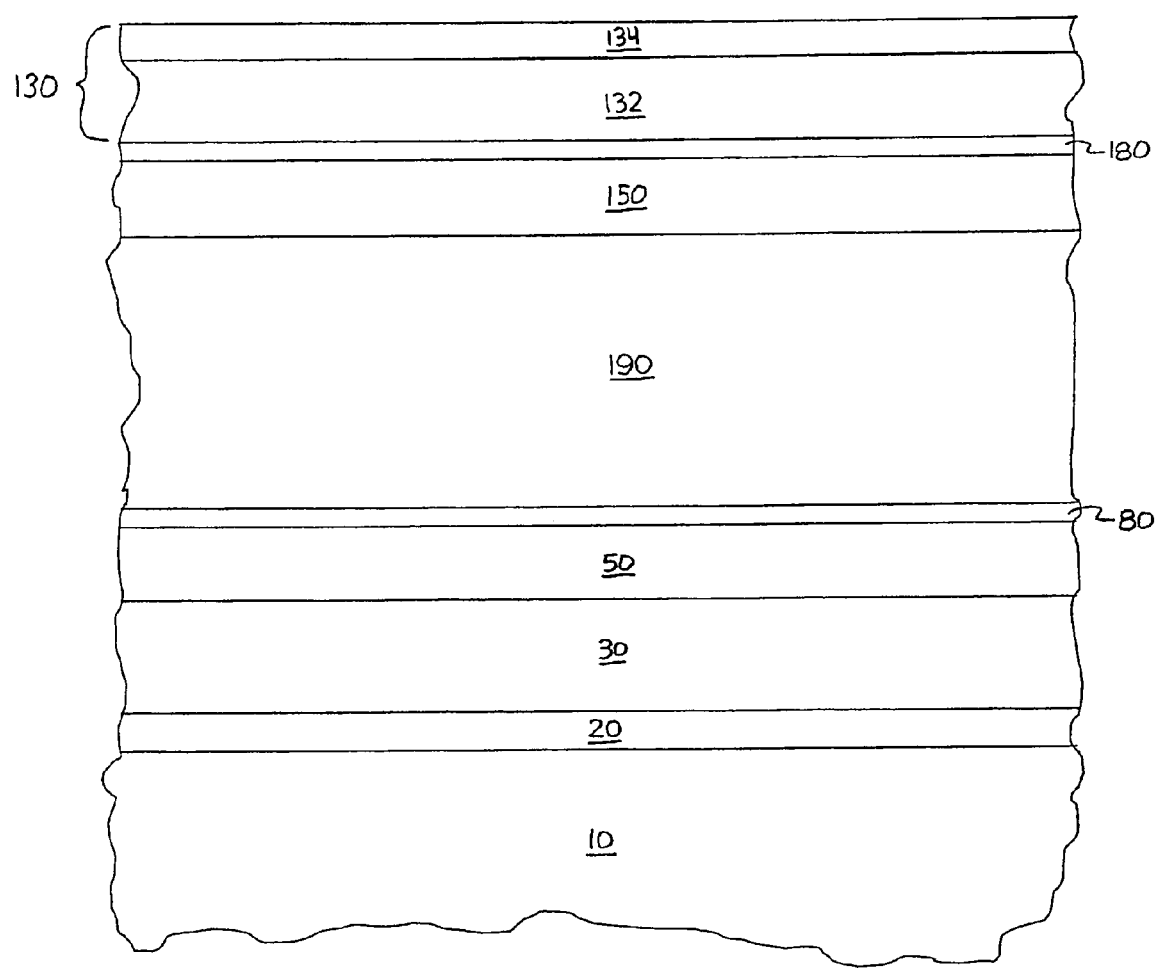
FIG. 4 is a schematic cross-sectional view of still another embodiment of a film stack in accordance with the invention.
Figure 5:
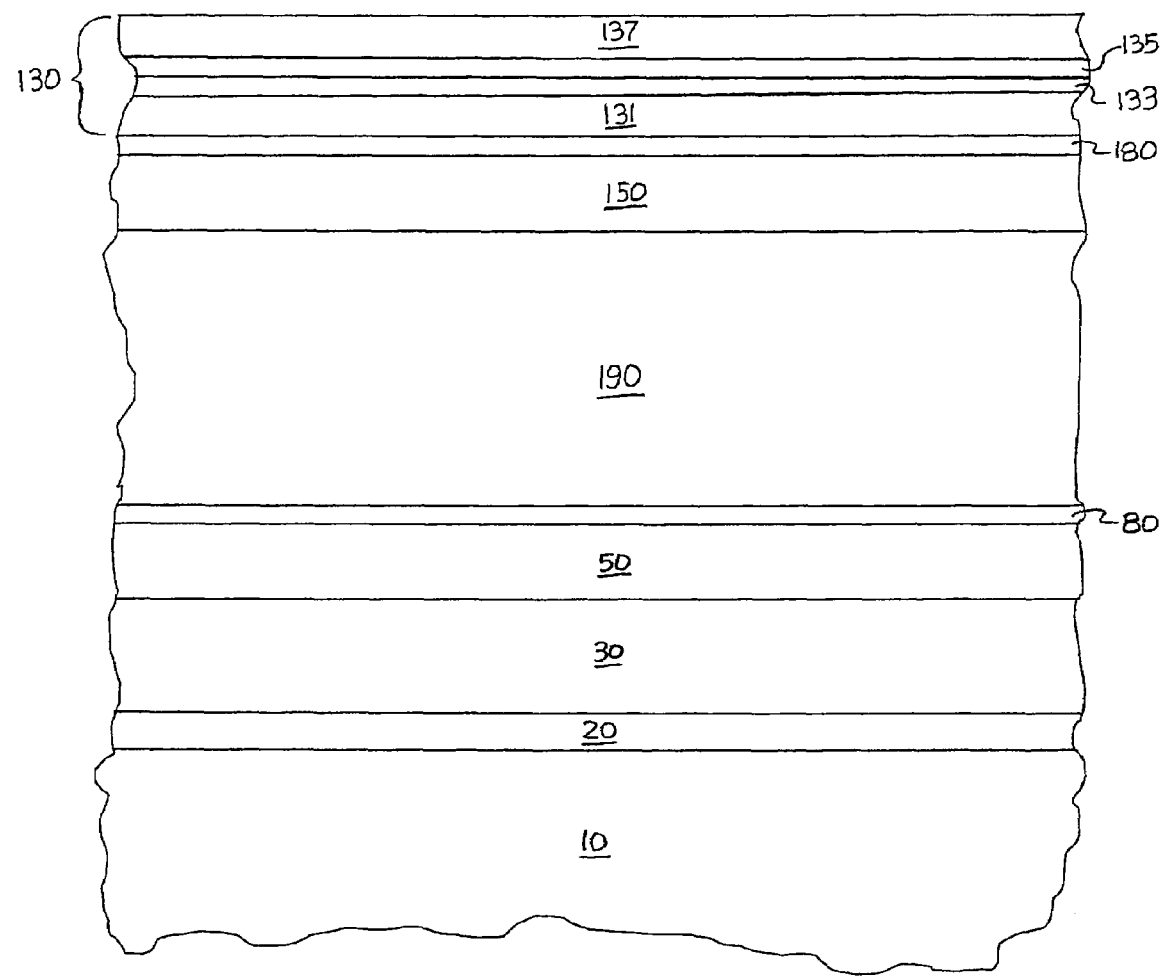
FIG. 5 is a schematic cross-sectional view of yet another embodiment of a film stack in accordance with the invention.

FIGS. 4 and 5 illustrate embodiments wherein the outer film region 130 is formed of a plurality of separate layers. For example, the embodiment of FIG. 4 has an outer film region 130 comprising two separate layers. In the illustrated embodiment, a first outer layer 132 is deposited directly upon the optional second protective layer 180. The first outer layer 132 can be formed of any desired transparent dielectric material. For example, this layer 132 can be advantageously formed of zinc oxide. The thickness of the first outer layer 132 is preferably between about 125 Å and about 275 Å, and more preferably between about 150 Å and about 250 Å. In the illustrated embodiment, a second outer layer 134 is deposited directly upon the first outer layer 132. While this layer 134 can be formed of any desired transparent dielectric material, it is preferably formed of material with good durability. For example, this layer 134 can be advantageously formed of a chemically durable material, such as silicon nitride. Alternatively, this layer 134 can be formed of titanium nitride. The thickness of the second outer layer 134 is preferably between about 25 Å and about 300 Å, more preferably between about 50 Å and about 125 Å, and perhaps optimally between about 70 Å and about 100 Å. In one preferred embodiment, the first outer layer 132 is formed of zinc oxide at a thickness of about 175 Å and the second outer layer 134 is formed of silicon nitride at a thickness of about 75 Å. In another preferred embodiment, the first outer layer 132 is formed of zinc oxide at a thickness of about 225 Å and the second outer layer 134 is formed of silicon nitride at a thickness of about 96 Å. In yet another embodiment, the outer film region is formed of at least three films, including at least one titanium nitride film and at least one chemically durable film (e.g., silicon nitride), with the chemically durable film preferably, though not necessarily, being positioned outwardly from the titanium nitride film.

FIG. 5 illustrates a preferred embodiment wherein the outer film region 130 comprises at least four separate layers. Directly upon the optional second protective layer 180 is deposited a film layer 131 formed of, for example, an alloy or mixture of zinc oxide, such as an alloy or mixture of zinc oxide and bismuth oxide, tin oxide, or indium oxide. This film layer 131 is preferably deposited at a thickness of between about 50 Å and about 200 Å, more preferably between about 80 Å and about 115 Å, and perhaps optimally about 100 Å. In this embodiment, it is particularly preferred to sandwich a titanium nitride layer 135 between first 133 and second 137 chemically durable layers (e.g., silicon nitride), and to position this sandwich directly upon the film layer 131. In more detail, the innermost 133 of these silicon nitride layers preferably has a thickness on the order of about 22–55 Å, perhaps optimally about 30 Å. The titanium nitride layer 135 preferably has a thickness on the order of about 4–41 Å, perhaps optimally about 10 Å. The outermost silicon nitride layer 137 preferably has a thickness of about 75–179 Å, perhaps optimally about 110 Å.

A further embodiment of the invention will now be described. As with the two preceding embodiments, this film stack is a double-silver type low-emissivity coating. The layers of the film stack will be described in order, moving outwardly from the substrate. Directly upon the substrate, there is formed a silicon dioxide base layer of the nature and thickness described herein. Next, a layer of an alloy or mixture of zinc oxide, such as an alloy or mixture of zinc oxide and bismuth oxide, tin oxide, or indium oxide, is formed directly upon the base layer. This oxide layer preferably has a thickness of between about 250 Å and about 350 Å, perhaps optimally about 300 Å. Directly upon this oxide layer is applied a layer of pure zinc oxide. The thickness of this zinc oxide layer is preferably between about 70 Å and about 100 Å, perhaps optimally about 85 Å. An infrared-reflective silver layer is formed directly upon this zinc oxide layer. This silver layer preferably has a thickness of between about 90 Å and about 110 Å, perhaps optimally about 100 Å. A protective titanium layer is then applied directly upon this silver layer. The majority of this titanium may be oxidized or nitrided during the deposition of subsequent layers, as described above. The titanium of this layer is preferably deposited at a thickness of between about 20 Å and about 30 Å, perhaps optimally about 25 Å. Directly upon this titanium layer is applied a layer of pure zinc oxide, which layer preferably has a thickness of between about 80 Å and about 120 Å, perhaps optimally about 100 Å. Directly upon this zinc oxide layer is applied a layer of an alloy or mixture of zinc oxide, such as an alloy or mixture of zinc oxide and bismuth oxide, tin oxide, or indium oxide. This oxide layer preferably has a thickness of between about 530 Å and about 620 Å, and more preferably between about 550 Å and about 600 Å. Directly upon this oxide layer is formed a layer of pure zinc oxide, which layer preferably has a thickness of between about 65 Å and about 105 Å, perhaps optimally about 85 Å. An infrared-reflective silver layer is formed directly upon this zinc oxide layer. This silver layer preferably has a thickness of between about 105 Å and about 145 Å, perhaps optimally about 125 Å. A protective titanium layer, which may subsequently be oxidized or nitrided, is then applied directly upon this silver layer. The titanium of this layer is preferably deposited at a thickness of between about 20 Å and about 30 Å, perhaps optimally about 20 Å. Directly upon this titanium layer is applied a layer of pure zinc oxide, which layer preferably has a thickness of between about 110 Å and about 130 Å, perhaps optimally about 120 Å. Directly upon this zinc oxide layer is deposited a layer of an alloy or mixture of zinc oxide, such as an alloy or mixture of zinc oxide and bismuth oxide, tin oxide, or indium oxide. This oxide layer preferably has a thickness of between about 130 Å and about 170 Å, perhaps optimally about 150 Å. Directly upon this oxide layer is formed a layer of silicon nitride, which preferably forms the outermost layer of the film stack. Preferably, this silicon nitride layer has a thickness of between about 20 Å and about 50 Å, and more preferably between about 30 Å and about 40 Å. Those skilled in the art would be able to readily select and vary other suitable layer compositions and thicknesses that are outside these preferred ranges yet produce acceptable results.

Yet another embodiment of the invention will now be described. The layers of this coating (which is also a double-silver type low-emissivity film stack) will be described in order, moving outwardly from the substrate. A silicon dioxide base layer of the nature and thickness described herein is formed directly upon the substrate. Directly upon the silicon dioxide base layer is formed a layer of titanium oxide (e.g., titanium dioxide, which may be substoichiometric $TiO_x$, where x is between 1 and 2). This titanium oxide layer preferably has a thickness of between about 115 Å and about 145 Å, perhaps optimally about 130 Å. Directly upon this titanium oxide layer is applied a layer of pure zinc oxide. The thickness of this zinc oxide layer is preferably between about 40 Å and about 60 Å, perhaps optimally about 50 Å. An infrared-reflective silver layer is formed directly upon this zinc oxide layer. This silver layer preferably has a thickness of between about 80 Å and about 100 Å, perhaps optimally about 90 Å. A protective nickel or nichrome layer is formed directly upon this silver layer. For example, this protective layer may be formed of a Ni:Cr alloy (e.g., 50:50), as described in U.S. Pat. No. 5,344,718, issued to Hartig et al., the entire teachings of which are incorporated herein by reference. This protective layer, which may subsequently be oxidized or nitrided, is preferably deposited at a thickness of between about 20 Å and about 30 Å, perhaps optimally about 25 Å. Directly upon this protective layer is applied a layer of silicon nitride, which layer preferably has a thickness of between about 400 Å and about 600 Å, perhaps optimally about 500 Å. Directly upon this silicon nitride layer is applied a layer of pure zinc oxide. This zinc oxide layer preferably has a thickness of between about 30 Å and about 50 Å, perhaps optimally about 40 Å. Directly upon this zinc oxide layer is formed a layer of infrared-reflective silver layer. This silver layer preferably has a thickness of between about 80 Å and about 130 Å, and more preferably between about 100 Å and about 110 Å. A protective nickel or nichrome layer (as described above) is formed directly upon this silver. This protective layer, which may subsequently be oxidized or nitrided, is preferably deposited at a thickness of between about 20 Å and about 30 Å, perhaps optimally about 25 Å. Directly upon this protective layer is applied a layer of silicon nitride, which preferably forms the outermost layer of the film stack. The preferred thickness range for this silicon nitride layer is between about 250 Å and about 310 Å, perhaps optimally about 280 Å. Those having ordinary skill in the present art would be able to readily select and vary other suitable layer compositions and thicknesses that are outside these preferred ranges yet produce acceptable results.

Figure 6:
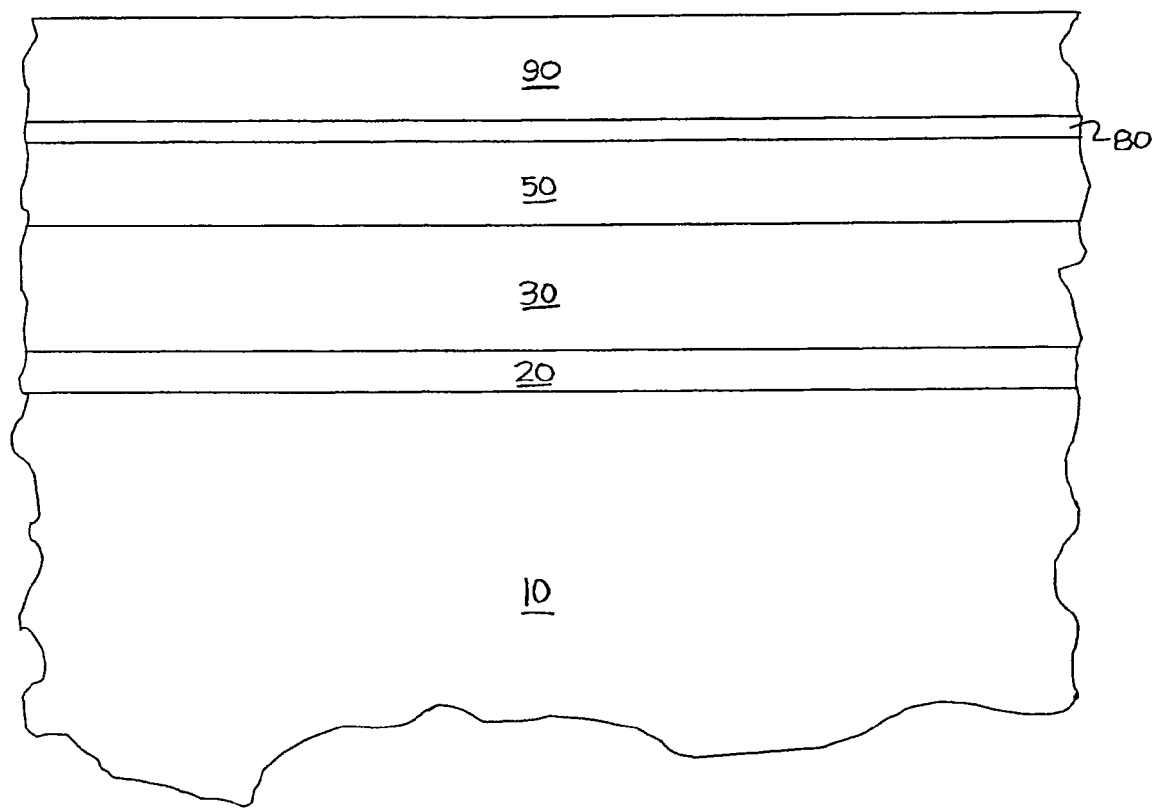
FIG. 6 is a schematic cross-sectional view of a further embodiment of a film stack in accordance with the invention.

FIG. 6 depicts a low-emissivity coating with a single infrared-reflective layer. The transparent base layer 20, second layer 30, infrared-reflective layer 50, and optional protective layer 80 in this embodiment can be formed in accordance with the descriptions of these layers 20, 30, 50, 80 provided above with reference to the embodiments of FIGS. 2–5. With respect to low-emissivity coatings that have only a single infrared-reflective layer, the overall thickness of the second layer 30 is preferably between about 85 Å and about 400 Å, and more preferably between about 100 Å and about 250 Å, and the thickness of the infrared-reflective layer 50 is preferably at least about 65 Å. This will typically achieve a very desirable level of infrared reflectivity. For example, in one embodiment, the base layer 20 comprises silicon dioxide at a thickness of about 70 angstroms, the second layer 30 comprises zinc oxide at a thickness of about 100 angstroms, and the infrared-reflective layer 50 comprises silver at a thickness of about 85–100 angstroms.

The outermost film region 90 depicted in FIG. 6 can be formed of the same layer or layers that were described above for the intermediate film region 190 in FIGS. 2–5. In its simplest form, the outermost film region can be a single transparent dielectric film applied at a thickness of between about 200 Å and about 700 Å. As noted above, those skilled in the present art would be able to readily select and vary suitable materials for use as the outermost layer of a low-emissivity coating. Briefly, though, useful materials include silicon nitride and oxides of zinc, tin, indium, bismuth, titanium, hafnium, zirconium, and alloys and mixtures thereof. If so desired, a titanium nitride film and/or a chemically durable film (e.g., silicon nitride) can be applied over this film region 90. For example, it may be particularly desirable to apply a sandwich of silicon nitride, titanium nitride, and silicon nitride films over this film region 90.

In one particularly preferred embodiment (not shown), the outermost film region 90 is formed of the following six layers: (1) zinc oxide applied at a thickness of about 38 Å directly upon the protective layer 80; (2) silicon nitride applied at a thickness of about 45 Å directly upon the preceding zinc oxide layer; (3) zinc oxide applied at a thickness of about 30–42 Å directly upon the preceding silicon nitride layer; (4) silicon nitride applied at a thickness of about 50 Å directly upon the preceding zinc oxide layer; (5) zinc oxide applied at a thickness of about 156 Å directly upon the preceding silicon nitride layer; and (6) silicon nitride applied at a thickness of about 65–75 Å directly upon the preceding zinc oxide layer. In this embodiment, it is anticipated that the thickness of any given layer can be varied by as much as about 15% while still achieving good results.

The film stacks described in this disclosure posses an exceptional degree of stability to elevated temperature processing. For example, these film stacks have been found to develop little, if any, visible haze (e.g., of the nature described above) when applied to moisture corroded glass and tempered along with the glass. In more detail, both the single and double infrared-reflective layer coatings described above have been found consistently to develop no readily apparent visible haze when subjected to conventional soda lime glass tempering procedures. In fact, these coatings have been found to withstand exposure to temperatures of about 700 degrees C. without developing any objectionable haze. Thus, the present film stacks are anticipated to be ideal for use as temperable glass coatings, and therefore offer particularly utility in many architectural and automotive applications.

To illustrate the impact of the present base layer on a temperable low-emissivity coating, the following example is provided.

EXAMPLE 1

Sheets of conventional soda lime glass (having a thickness of 3 mm) were obtained. Two batches of the glass sheets were coated with double-silver low-emissivity coatings. The coating on the first batch of glass sheets was provided with a silicon dioxide base layer in accordance with the present teaching. The first batch of coated glass is referred to herein as Sample A. The coating on the second batch of glass sheets was equivalent to the Sample A coating, except that the silicon dioxide base layer was omitted. The second batch of coated glass is referred to herein as Sample B. All of the Sample A and Sample B films were deposited by magnetron sputtering.

Sample A

As noted above, the coating applied to the first batch of sheets was provided with a silicon dioxide base layer. The base layer had a thickness of about 80 angstroms and was applied directly upon one of the major surfaces of the substrate. Directly upon the silicon dioxide base layer was applied a layer of zinc oxide. The thickness of this zinc oxide layer was about 230 Å. An infrared-reflective silver layer was applied directly upon this zinc oxide layer. This silver layer had a thickness of about 80 Å. A protective layer of niobium was then applied directly upon this silver layer. This niobium layer was deposited at a thickness of about 20 Å. Directly upon this niobium layer was applied a layer of zinc oxide at a thickness of about 105 Å. A silicon nitride layer was then applied directly upon this zinc oxide layer. This silicon nitride layer had a thickness of about 140 Å. Directly upon this silicon nitride layer was applied a layer of zinc oxide at a thickness of about 200 Å. A silicon nitride layer was then applied directly upon this zinc oxide layer. This silicon nitride layer had a thickness of about 140 Å. Directly upon this silicon nitride layer was applied zinc oxide at a thickness of about 80 Å. An infrared-reflective silver layer was formed directly upon this zinc oxide. This silver layer had a thickness of about 130 Å. A protective layer of niobium was applied directly upon this silver layer. This niobium layer was deposited at a thickness of about 20 Å. Directly upon this niobium layer was applied a layer of zinc oxide. This zinc oxide layer had a thickness of about 100 Å. A silicon nitride layer was then deposited directly upon this zinc oxide layer. This silicon nitride layer preferably has a thickness of about 30 Å. A layer of titanium nitride was then formed directly upon this silicon nitride layer. This titanium nitride layer had a thickness of about 10 Å. Directly upon this titanium nitride layer was applied silicon nitride at a thickness of about 110 Å. This silicon nitride layer formed the outermost layer of the film stack.

Sample B

As described above, the coating applied to the second batch of sheets was equivalent to the Sample A coating, except the silicon dioxide base layer was omitted.

The coated glass sheets of Sample A and Sample B were then the subjected to a conventional glass tempering procedure. A single load of glass sheets was positioned in a convection-type furnace and exposed to elevated temperatures reaching about 734 degrees C. The time taken to reach this temperature was about 109 seconds. The glass was then air quenched.

After tempering, the Sample A and Sample B sheets were inspected for visible haze. Two different haze assessments were undertaken. First, the glass sheets were placed outdoors and retained in a generally vertical configuration (i.e., with the major surfaces of the glass sheets oriented generally vertically). The reflection of natural sunlight was then viewed at different glancing angles to assess any visible haze in the coated glass. Second, the glass sheets were placed indoors in a generally vertical configuration. A conventional high intensity light was provided, and the reflection of this light was viewed to assess any visible haze in the coated glass.

The results of both haze inspections consistently revealed that the Sample B glass (on which the silicon dioxide base layer was omitted) had a reddish appearance characterized by readily visible haze. Glass of this nature would typically be rejected in the marketplace for architectural and automotive glass. To the contrary, the Sample A glass (on which the silicon dioxide base layer was provided) had a neutral color, with no readily discernable red hue, and characterized by either no haze or very minimal haze of neutral color. Thus, the appearance of Sample A glass was much better than that of Sample B glass. While this example shows benefits of the present base layer in the context of tempering flat glass, it is to be understood that similar benefits would also be achieved in the heat bending of coated glass.

While preferred embodiments of the present invention have been described, it should be understood that numerous changes, adaptations, and modifications can be made therein without departing from the spirit of the invention and the scope of the appended claims.

What is claimed is:

1. A substrate bearing a low-emissivity coating, the low-emissivity coating comprising, moving outwardly from the substrate: a) a first film layer comprising amorphous material formed directly on the substrate, the first film layer having a thickness of less than 100 angstroms; b) a second film layer comprising a transparent dielectric material; c) a third film layer comprising an infrared-reflective material; d) an intermediate film region comprising at least three layers each having a physical thickness of less than 200 angstroms; e) a seventh film layer comprising an infrared-reflective material; and f) an eighth film layer comprising a transparent dielectric material, wherein the substrate has an index of refraction of between about 1.4 and about 1.5, and wherein the first film layer has an index of refraction of between about 1.4 and about 1.5.

2. The substrate of claim 1 wherein at least one of the intermediate film region layers is silicon nitride.

3. The substrate of claim 2 wherein the silicon nitride layer has a thickness of less than about 180 angstroms.

4. A substrate bearing a low-emissivity coating, the low-emissivity coating comprising, moving outwardly from the substrate: a) a first film layer comprising amorphous material formed directly on the substrate, the first film layer having a thickness of less than 100 angstroms; b) a second film layer comprising a transparent dielectric material; c) a third film layer comprising an infrared-reflective material; d) an intermediate film region comprising at least three layers including two or more silicon nitride films separated from one another by a film of a material other than silicon nitride, wherein each of the silicon nitride films has a thickness of less than 200 angstroms; e) a seventh film layer comprising an infrared-reflective material; and f) an eighth film layer comprising a transparent dielectric material, wherein the substrate has an index of refraction of between about 1.4 and about 1.5, and wherein the first film layer has an index of refraction of between about 1.4 and about 1.5.

5. The substrate of claim 4 wherein the silicon nitride films are separated from one another by one or more oxide layers.

6. The substrate of claim 4 wherein the silicon nitride films each have a thickness of less than about 180 angstroms.

7. A transparent substrate having a given index of refraction of between about 1.4 and about 1.5, the substrate bearing a low-emissivity coating comprising, moving outwardly from the substrate: a) a first film layer comprising transparent material having an index of refraction of between about 1.4 and about 1.5, the first film layer being formed directly upon the substrate at a thickness of less than 100 angstroms; b) a second film layer comprising a transparent dielectric material; c) a third film layer comprising an infrared-reflective material; d) a fourth film layer comprising a transparent dielectric material; and e) a chemically durable film layer further from the substrate than the fourth film layer, the chemically durable film layer comprising silicon nitride.

8. The substrate of claim 7 wherein the transparent material of the first film layer is silicon dioxide.

9. The substrate of claim 7 wherein the first film layer has a thickness of less than about 90 angstroms.

10. The substrate of claim 9 wherein the first film layer has a thickness of between about 50 angstroms and about 90 angstroms.

11. The substrate of claim 7 further comprising: a) a fifth film layer comprising an infrared-reflective material; and b) a sixth film layer comprising a transparent dielectric material.

12. The substrate of claim 11 wherein said infrared-reflective material is silver.

13. A transparent substrate having a given index of refraction of between about 1.4 and about 1.5, the substrate having a moisture-corroded major surface bearing a low-emissivity coating comprising, moving outwardly from the substrate: a) a first film layer of amorphous material formed directly upon said moisture-corroded major surface of the substrate, the first film layer having a thickness of less than 100 angstroms and having an index of refraction of between about 1.4 and about 1.5; b) a second film layer comprising a transparent dielectric material; c) a third film layer comprising an infrared-reflective material; d) a fourth film layer comprising a transparent dielectric material; and e) a chemically durable film layer further from the substrate than the fourth film layer, the chemically durable film layer comprising silicon nitride.

14. The transparent substrate of claim 13 wherein the first film layer comprises a substantially non-porous film layer.

15. The transparent substrate of claim 13 wherein the first film layer comprises a sputtered amorphous film layer.

16. The transparent substrate of claim 13 wherein the amorphous material comprises amorphous silicon dioxide.

17. The substrate of claim 13 wherein the first film layer has a thickness of less than about 90 angstroms.

18. The substrate of claim 17 wherein the first film layer comprising silicon dioxide has a thickness of between about 50 angstroms and about 90 angstroms.

19. The substrate of claim 13 further comprising: a) a fifth film layer comprising an infrared-reflective material; and b) a sixth film layer comprising a transparent dielectric material.

20. The substrate of claim 19 wherein said infrared-reflective material is silver.

* * * * *